United States Patent [19]
Preist et al.

[11] Patent Number: 5,808,919
[45] Date of Patent: Sep. 15, 1998

[54] DIAGNOSTIC SYSTEM

[75] Inventors: Christopher William Preist, Montpellier, United Kingdom; David Allport, Boston, Mass.

[73] Assignee: Hewlett-Packard Company, Palo Alto, Calif.

[21] Appl. No.: 551,054

[22] Filed: Oct. 31, 1995

Related U.S. Application Data

[63] Continuation-in-part of Ser. No. 291,107, Aug. 16, 1994, abandoned.

[30] Foreign Application Priority Data

Nov. 23, 1993 [GB] United Kingdom ................. 93309329

[51] Int. Cl.⁶ .................................................. G05B 19/048
[52] U.S. Cl. .......................... 364/579; 364/578; 371/22.1
[58] Field of Search .................................. 364/578, 579, 364/580; 371/22.1, 22.4, 22.6, 25.1, 26

[56] References Cited

U.S. PATENT DOCUMENTS

| | | | |
|---|---|---|---|
| 4,192,451 | 3/1980 | Swerling et al. | 371/22.4 |
| 4,588,945 | 5/1986 | Groves et al. | 371/22.6 |
| 4,590,562 | 5/1986 | Zwicke et al. | 364/431.02 |
| 4,907,230 | 3/1990 | Heller et al. | 371/22.1 |
| 5,001,714 | 3/1991 | Stark et al. | 371/26 |
| 5,051,996 | 9/1991 | Bergeson et al. | 371/22.4 |
| 5,099,436 | 3/1992 | McCown et al. | 364/550 |
| 5,144,225 | 9/1992 | Talbot et al. | 324/73.1 |
| 5,253,184 | 10/1993 | Kleinschnitz | 364/550 |
| 5,327,437 | 7/1994 | Balzer | 371/25.1 |
| 5,381,417 | 1/1995 | Loopik et al. | 364/579 |
| 5,412,584 | 5/1995 | Umeno et al. | 364/558 |
| 5,488,722 | 1/1996 | Potok | 395/600 |
| 5,617,430 | 4/1997 | Angelotti et al. | 371/27 |

FOREIGN PATENT DOCUMENTS

| | | |
|---|---|---|
| 0 296 884 A2 | 6/1988 | European Pat. Off. . |
| 0 413 512 A2 | 9/1990 | European Pat. Off. . |
| 0413512A2 | 2/1991 | European Pat. Off. ................. 11/22 |

OTHER PUBLICATIONS

European Search Report of corresponding European application.

*Primary Examiner*—Emanuel T. Voeltz
*Assistant Examiner*—Patrick Assouad

[57] ABSTRACT

A diagnostic system (10) for diagnosing the cause of failures of functional tests made on a system under test wherein the system under test comprises a plurality of interacting components and wherein the diagnostic system (10) comprises means (20) for interpreting test results based on the set of operations which are involved in carrying out the tests and which components are exercised by operations.

9 Claims, 1 Drawing Sheet

DIAGNOSTIC SYSTEM

CROSS REFERENCE TO RELATED APPLICATION

This is a continuation-in-part of application Ser. No. 08/291,107 filed on Aug. 16, 1994, now abandoned.

TECHNICAL FIELD

The present invention relates to a system for diagnosing faults in systems and is relevant to diagnosing faults in systems which consist of interacting components where it is the functionality of the components which has been tested.

The present invention relates particularly but not exclusively to a system for diagnosing faults in printed circuit boards which have failed their functional test during manufacture. The present invention is not relevant to in-circuit testing of circuit boards where the individual components on the board are tested using probes and diagnosis is not required. However it is applicable in cases where in-circuit testing needs to be supplemented by the functional testing of clusters of components which are not individually tested.

BACKGROUND ART

History-based systems in the form of fault dictionaries and expert systems have been used to address the problem of fault diagnosis. However, it can take a long time for such a system to begin to perform well in view of the need to build up a substantial body of case data and this is not compatible with the current trend towards products with ever shorter production lifecycles.

Many existing diagnostic systems define diagnosis in terms of a sequence of tests which are performed, usually by a test engineer with guidance from the diagnostic system, in the search for a diagnosis. Such diagnostic systems may be integrated with the system for carrying out the functional testing. The diagnostic strategy is often a repeated cycle of test and diagnostic refinement which requires repeat cycles of system calls from the diagnostic system to the test system. This process is often time-consuming and not cost-effective.

Known board diagnosis systems typically reason about each part of the board separately, using measurements from points that lie in between modules of the board under test to determine the location of the problem. This approach requires probes to be placed on internal parts of the board by a test engineer and makes the assumption that such measurements are themselves correct.

There are some known diagnostic systems which use only information provided to the system prior to testing to reason about diagnosis. However, such systems require a full structural description of the system under test as a model to be used in diagnosis and this can be time-consuming to develop and difficult to maintain if the system being diagnosed undergoes revision.

DISCLOSURE OF INVENTION

The present invention aims to provide a diagnostic system which overcomes some or all of the disadvantages of known systems.

According to the present invention we provide a diagnostic system for diagnosing the cause of failures of functional tests made on a system under test wherein the system under test comprises a plurality of interacting components and wherein the diagnostic system comprises means for interpreting test results according to a set of operations which are involved in carrying out the tests.

For these purposes the term 'component' covers any structural item of a system ranging from the simplest elements through to complex parts. The connotation to be given to the term 'component' in any given system under test depends on the level to which it is desirable to be able to diagnose faults. For example, on a circuit board, it may be desirable to be able to diagnose faults down to the level of resistors, capacitors etc so that faulty ones can be replaced in which case these circuit elements would be components in this context. Alternatively, on a multi-chip module, it would be desirable to diagnose faults down to the level of the chips. In a computer network, it may be satisfactory to diagnose faults down to the level of a PC on the network and the PC would be a component of that system in this context.

For these purposes the term 'operation' refers to the behavioural aspects of the system under test which are not necessarily synonymous with its structural aspects. The operations of a system are the processes/actions which are tested when the system undergoes functional testing. For example, an operation might be 'access memory' in the context of a circuit board comprising a memory chip. Note that these are not necessarily the same as the processes which are carried out when the system is functioning in everyday use—they may be specific to the way in which the system is tested.

A significant advantage of a system according to the present invention is that diagnosis is carried out by interpreting existing test results which means that full use of existing test data is made to derive diagnostic information. A system according to the present invention finds the maximum diagnostic information that can be derived from an existing set of test results and allows the test engineer to take a decision about further action, preferably with the help of a ranked list of possible diagnoses produced by the system. This reduces the chance that further tests will need to be carried out during the diagnosis stage and also reduces the need to represent knowledge to be used during intermediate stages of the diagnostic process as in many known systems.

Another advantage of a system according to the present invention is that it enables rapid development of a knowledge base for a new product to be tested and is easy to adapt to diagnose new generations of existing products. This is because a system according to the present invention is relatively quick and simple to configure compared with known systems.

In the embodiments to be described, the system comprises means for interpreting test results based on the degree to which the operations utilise the components in the system under test. Preferably, the degree to which the operations utilise the components in the system under test is able to be entered as a qualitative estimate eg. high, medium or low, which is easy for an test engineer to provide.

Preferably, the system is operable to recognise when an operation is involved in both failing and passing tests (an 'operation violation') and to interpret results from such tests to help prioritise the likelihood of components of the system under test which are involved in carrying out the operation having caused test failure. This feature helps to improve the diagnostic capability of the system without significantly increasing system overheads. In the embodiment to be described the diagnostic system is operable to apply a penalty factor for each candidate diagnosis which involves operation violations.

A system according to the present invention can deliver a ranked list of possible diagnoses much faster than known systems owing to the simplicity of the test models which are used.

Occasionally the results of tests carried out on individual ones of the modules of the system under test may be available and it can be beneficial to make use of these. Accordingly the diagnostic system may be operable to utilise the results of individual module tests generated prior to the system test.

A diagnostic system according to any preceding claim preferably comprises means for indicating further tests which could usefully be carried out following diagnosis. These indications form guidance for a test engineer if there is a need to take the diagnostic process further.

Preferably, the diagnostic system is integrated with a functional test system so that it further comprises:

means for storing test definitions;

means for performing tests on the system under test;

means for storing test results;

and wherein the diagnostic system is operable automatically to utilise the test results to diagnose the causes of test failures.

An integrated test and diagnosis system of this kind is relatively easy to achieve because all that is required for the diagnosis stage is a list of the test results. Consequently, a diagnostic system of the present invention has potential for integration with a wide range of test hardware.

BRIEF DESCRIPTION OF THE DRAWINGS

A particular embodiment of the present invention will now be described, by way of example, with reference to the accompanying FIG. 1 which is a block diagram of the components of a system according to the present invention.

BEST MODE FOR CARRYING OUT THE INVENTION, & INDUSTRIAL APPLICABILITY

Figure 1:
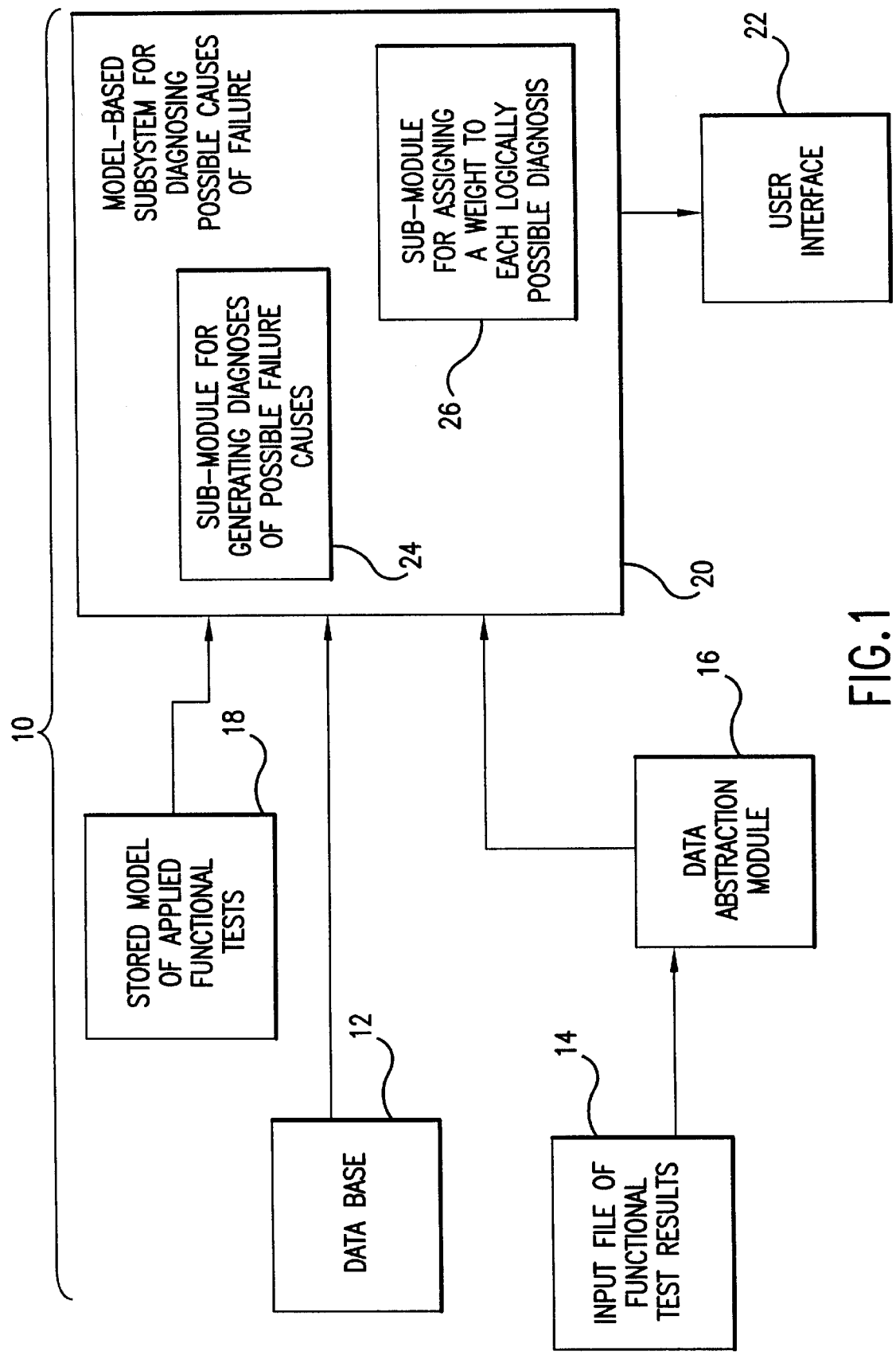

A preferred embodiment of the present invention is a system for diagnosing printed circuit boards from functional test results. The system may be used in conjunction with functional test equipment such as the HP 3079CT functional tester marketed by the applicant. The diagnostic system may be integrated with the functional test system by connecting a workstation or PC running a diagnostic system according to the present invention to the functional test system. The workstation/PC needs sufficient memory to store the data relating to the system under test.

The system of the present invention is most suitably implemented in software and any programming language may be used.

Referring to FIG. 1, a diagnostic system 10 of the present invention comprises:

a database 12 for storing data concerning the components on a circuit board being diagnosed;

an input file 14 of functional test results for a circuit board which has failed functional test;

a data abstraction module 16 for translating quantitative test results into qualitative test results;

a module 18 for storing a model of the functional tests applied to the circuit board;

a model-based sub-system 20 for diagnosing possible causes of failure of the circuit board;

a user interface 22 for presenting the results of diagnosis to the user.

These components will now be more fully described.

The Component Database

The database 12 is created by the system programmer and stores the following data concerning the components on the board:

comp_data(<component-name>, <component_reference>, <part_number>, <prior_probability>, <prior_test_coverage>, <text>) subcomps(<component_name>, {subcomponent}).

where the arguments are as follows:

<component_name>::−<atom>|f(x1, . . . xn)

this is the "abstract name" of a component on a board, e.g. slic(L). These are the names referred to by the test_specification and function_specification predicates.

<component reference>::−<atom>|f(x1, . . . xn)

this refers to the component as described on a circuit diagram, e.g. icx002

<part_number>::−<atom>|f(x1, . . . xn)

this refers to the component as described in parts lists etc., e.g. v1239987

<prior_probability>::−E [0,1]

this is a number in the range zero to one and gives the prior probability of this component's failure typically based upon parts per million failure rates from suppliers or other historical data.

<prior_test_coverage>::−E[0,1]

this a number in the range zero to one and gives an indication of the extent to which this component has been tested by prior testing, such as in-circuit testing <text>::−string this gives a description of the component to be used in the final diagnostic output.

<subcomponent>::−<atom>|f(x1, . . . xn)

this gives the name of a subcomponent.

An example of components and sub-components in this context is a memory block component which comprises memory chip and decoder sub-components. The dividing line between what is a component and what is a sub-component is domain-specific. As explained above the choice of what are defined as components of the system depends on the level down to which it is desired to diagnose faults. The choice of what are defined as sub-components of the system depends on what added reasoning can be gained and this becomes apparent as the set of functional tests are defined in the functional test model.

It is noteworthy that the component database 12 does not contain information about the behaviour of components or about the way in which components are interconnected. This makes the components database relatively simple to compile and distinguishes the present system from prior art systems requiring behavioural information in which compiling the component database is a major exercise.

Input File

The contents of the input file 14 are supplied from the functional test equipment. The form of the data received by the diagnostic system as input is as follows:

test_result(<board_id>, <timestamp>, <test_name>, <result>)

board_prior_testing(<board_id>, <timestamp>, <boolean>)

where the arguments are as follows:

<board_id>::−<atom> this gives an alphanumeric serial number which uniquely identifies the board being tested.

<timestamp>::−<string> this gives the time and date of testing.

<result>::−<atom> this gives a numerical or symbolic value, corresponding to the result returned by the test.

<boolean>::=true|false this is true if the board has been put through prior tests, false if it has not.

The Data Abstraction Module

The data abstraction module is a procedural program for deriving a higher level representation of a test result from a numeric test result. For a given test, the system programmer specifies which numeric values correspond to a test pass, and which correspond to a fail. They can also subdivide 'fail' into different categories of failure, such as 'high' or 'low', and assign ranges of values to each of these. These ranges are assigned using the following database definition:
result_mapping(<test_name>, <numeric_range>, <qualitative_result>) <test_name>::–<atom>|f(x1, . . . xn)

this gives the name of the test for which a qualitative result is being defined.

<numeric_range>::–[Real,Real]

this represents the range of numbers falling between the two real numbers listed. A range can also contain –inf or +inf, to represent a range to infinity.

<qualitative_result>::–<atom> this is the qualitative result name given to any value falling within this range.

For each test, a 'pass' result will be defined, and one or more different modes of fail result also. For example:
result_mapping(voltage_test, [4.7,5.3],pass).
result_mapping(voltage_test, [0,4.7], fail_low).
result_mapping(voltage_test, [5.3,inf],fail_high).

This defines the range of voltages 4.7 to 5.3 to be a test pass, below 4.7 to be a low failure, and above 5.3 to be a high failure.

The Functional Test Model

The functional test model is defined by the system programmer at the outset and is a model of the functional tests applied to the circuit board. The functional test model includes information about what operations are performed in the system under test in the course of the test and an estimate of the extent to which those operations exercise the components of the system under test. This information is simple for an experienced test engineer to supply which is another reason why a system according to the present invention is relatively simple and fast to configure.

Each of the functional tests is defined as follows:
test specification(<test_name>, {operation name})

where the arguments are as follows:
<test_name>::–<atom>|f(x1, . . . xn)
<operation name>::–<atom>|f(x1, . . . xn)

this specifies that the given test consists of the specified set of operations. Each operation represents a part of that test's usage of the circuit under test. Consider the following example:
test_specification(memory_test,[access_memory,output_to_busport]).

This simply means that the memory test performs two operations; it accesses the memory, and outputs the contents to the bus port.

The operations used in the test specifications are specified as follows:
operation_specification(<operation name>,{component_utilisation},)

where the arguments are as follows:
<component_utilisation>::=<component_designator>, <utilisation><utilisation>::–E [0,1]
<component_designator>::=<component_name>|<subcomponent_name>
<subcomponent_name>::–<component_name>, <subcomponent>

These entries in the model specify how the given operation exercises the components and subcomponents on the board. Each component or subcomponent exercised by the operation is listed, and an estimated degree of utilisation is given which specifies the extent to which the functionality of that component is exercised by the operation in question.

Consider the following example:

```
operation_specification (access_memory,    [   [cpu, 0.2],
                                               [[ram, decoder], 0.9],
                                               [[ram, memory], 0.2],
                                           ]   ).

operation_specification (output_to_busport, [  [databus, 0.7],
                                               [port, 0.9]
                                           ]   ).
```

This specification states that the access_memory operation exercises the cpu slightly, the decoder submodule of the ram almost completely, and the memory submodule of the ram slightly.

Sometimes there is additional information which it is useful to program into the diagnostic system. One example is:
failure_definition(<test_name>, <qualitative_result>, <failure_spec>)

where the arguments are:
<qualitative_result>::–atom
<failure_spec>::–<indict_list>, <acquit_list><indict_list>::–{<operation_name>|<component_utlisation>}
<acquit_list>::–{<operation_name>|<component_utilisation>}.

The failure definition for a particular qualitative result is used to capture any additional information which that qualitative result provides. It allows the system programmer to specify that, if that result occurs, it is not simply any component tested by the failing test which can be responsible, but instead is a member of the indict list. Note that sometimes a failing test can tend to exonerate a particular component. For example, if a test results in a warning light being illuminated, the warning light must be good. Therefore, the acquit_list specifies operations that are considered to have completed a test correctly (i.e. as if used in a passing test) when this particular failure mode is seen.

For example:
failure definition(memory_tst,corruption

| [ | [[[ram, decoder],0.9], [[ram, memory], 0.1]], [[chip_select, 0.1]] | %indict %acquit |
|---|---|---|
| ] | ). | |

This states that if the memory test detects a corruption of the data, then either the decoder or memory modules of the ram is at fault. Additionally, this failure mode demonstrates that at least a small portion of chip-select is functioning correctly.

Failure definitions do not have to be provided for every test and every different failure type—only those for which such extra information exists.

Model Based Sub-System for Performing Diagnoses

The model-based sub-system for performing diagnosis is a key component of the system and comprises two sub-modules:

a sub-module 24 for generating diagnoses which may logically have caused the failure to occur;

a sub-module 26 for assigning a 'weight' to each of the logically possible diagnoses, where the weight corresponds to the relative probability of that diagnosis causing the observed functional test results.

The sub-module 24 generates logically possible diagnoses in two phases. Firstly, for each failed test, it generates the 'conflict set' of components corresponding to that failed test. The concept of conflict set is described in R. Reiter's "A theory of diagnosis from first principles" published in Artificial Intelligence 32(1):57–96, 1987 and is familiar to a person skilled in the art. In the present system, the conflict set consists of those (sub)components which are exercised by a test. Using the functional test model, each test specification includes an operation name which can be used to access the relevant operation specification which lists the components exercised by that operation.

For example, if the memory test failed, the conflict set of components would be those involved in the 'access memory' and 'output to busport' operations, namely:

[cpu, [ram, decoder], [ram, memory], databus, port]

Secondly, given a conflict set for each failed test, the system 10 constructs 'hitting sets' from these. The concept of 'hitting set', together with an algorithm for generating them, is described in the Reiter reference detailed above. In the present system, each hitting set corresponds to a logically possible diagnosis (D). By D therefore is meant a candidate diagnosis—one which is a possible cause of the relevant fault. For example, if there were only two conflict sets (in practice there could be many more) containing the following components:

conflict set$_1$: $\{c_1, c_2, c_3\}$
conflict set$_2$: $\{c_2, c_4, c_5\}$ then there are five hitting sets which are:

$\{c_2\}; \{c_1, c_4\}; \{c_1, c_5\}; \{c_3, c_4\}; \{c_3, c_5\}$ and these are the minimum alternative sets of components which could be responsible for the observed fault ie the candidate diagnoses (D).

The module 26 assigns a relative weight to each of the candidate diagnoses (D) as follows:

$$\text{Relative\_weight}(D) = \text{Relative\_Posterior\_Probability}(D) \times \text{Operation\_Violation\_Penalty}(D) \quad \text{Equation (1)}$$

The calculation of the Relative Posterior Probability is one which is carried out in known diagnosis systems. By 'relative' here is meant that the candidate diagnoses need to be ranked in order of probability rather than the absolute probability of each being calculated. The Relative Posterior Probability can be calculated using Bayes' Rule, or any of the standard variants. Bayes' Rule is:

$$p(D/R) = \frac{p(D) \times p(R|D)}{p(R)} \quad \text{Equation (2)}$$

where D=candidate diagnosis and R=set of test results.

Generally, the expression $p(X|Y)$ means 'the probability of X given Y' and is termed the 'posterior probability'. The expression $p(X)$ is 'the probability of X and is termed the 'prior probability'.

In the context of the present system:

$p(D)$ is the prior probability of the candidate diagnosis D i.e. the probability of the components involved in the candidate diagnosis failing when nothing is known about the actual performance of the system being diagnosed;

$p(D|R)$ is the posterior probability of the candidate diagnosis i.e. the probability of the components involved in the candidate diagnosis failing given a set of test results for the system being diagnosed;

$p(R|D)$ is the posterior probability of getting a given set of test results if a candidate diagnosis is correct. This is calculated from the degree of utilisation factors in the functional test model. If more than one failing test is involved, the relevant factors are multiplied together as described below;

$p(R)$ is the prior probability of given set of test results and, since the present system aims to derive relative posterior probabilities for the candidate diagnoses, the term $p(R)$ drops out as a common factor.

Assuming that components fail independently, the prior probability of the diagnosisis, $p(D)$, is found by multiplying together the prior probabilities of all components in the diagnosis, and this information is in the component database 12. If prior testing factors are used, e.g. previous in-circuit test results, the relevant probabilities derived from these tests are also multiplied together. For example, taking the candidate diagnosis $\{c_1, c_4\}$ above, the prior probabilities of the components $c_1$ and $c_4$ are multiplied together to give the prior probability of that candidate diagnosis. (Factors of 1.0 minus the prior failure probability for components not diagnosed should also be included; often, these factors are near enough to unity that they may be omitted.)

The posterior probability $p(R|D)$ is calculated using the functional test model stored in the module 18. The degree of utilisation of the components in the candidate diagnosis D by each test is related to a measure of the probability of the test failing given that the component fails.

For each candidate diagnosis D, $p(D)$ and $p(R|D)$ are used as inputs to Bayes rule, which returns the relative posterior probability of the diagnosis.

The next step is to apply an 'operation violation penalty' (a constant in the range zero to one) to candidate diagnoses involving operation violations i.e. operations involved in both passing and failing test results. The aim here is to recognise when operations are involved in both passing and failing tests and to interpret the results of such tests. In other words, if a candidate diagnosis requires an operation to fail in one test, and pass in another, it is penalised for this implied inconsistency.

An operation is violated if it fails in one test, causing the entire test to fail, yet passes in another test. As the operation is exercising the system under test in similar ways in both cases, it is unlikely to exhibit such behaviour. Accordingly, the candidate diagnosis can be penalized.

We determine if an operation violation must occur if a given candidate diagnosis D is to result in the observed test results, in the following way:

for each failed test t
  using the functional test model, search the operations involved in the failing test t for those which involve components C which form part of the relevant candidate diagnosis D;
  for each such operation, check whether that operation is also involved in a passing test;
  only if all such operations are involved in a passing test is an operation violation penalty to be applied.

When all failed tests have undergone this process, it is only if none of these indicate that an operation violation penalty needs to be applied that the relevant candidate diagnosis escapes the application of an operation violation penalty.

In practice, the process described above for any particular candidate diagnosis can be terminated once there is a failed test for which an operation violation penalty needs to be applied.

If a violation has taken place, then the operation_violation_penalty (D) of candidate diagnosis D is set to the value of the system constant 'operation_violation_penalty'. Otherwise, it is set to the value 1 (ie. no penalty).

Using Equation (1), a relative weight can then be assigned to each candidate diagnosis.

Examples are as follows
let component database entries include:
comp_data(cpu, ic1, intel486, 0.01, 0.1, 'central processor')
comp_data(port, sc1, 3452xx, 0.01, 0.9, 'parallel port')
Let test models be:
test_specification(memory_test, [access_memory, output_to_busport])
test_specification(video_test,[access_video, output_to_busport])
operation_specification(access_memory,
 [[cpu,0.2], [[ram,decoder],0.8],[[ram,memory],0.1]])
operation_specification(access_video,
 [[Cpu,0.2], [video-chip,0.9]])
operation_specification(output_to_busport,
 [[databus,0.7],[port,0.9]]).
Let the system constant operation_violation_penalty= 0.1.
Now assume that memory_test=fail and video_test=pass.
Then the only conflict set is:
{cpu, [ram,decoder], [ram,memory], databus}, {port}
So the candidate diagnoses are:
{cpu}, {[ram,decoder]}, {ram,memory}, {databus}, {port}
Consider applying submodule 26 to {cpu} to calculate the relative weight of this candidate diagnosis:

$$\text{relative\_posterior\_probability}(\{cpu\})=p(\text{test results}|cpu)*\text{prior\_probability}(cpu) \quad \text{(Equation 2)}$$

In general, probability of a test result is a function of utilisation that depends on underlying assumptions regarding failure mechanisms and their distribution. The general Bayesian approach requires integration of conditional distribution functions. The form of Bayes' rule presented in Equation (2) permits computation of posterior probability given estimates of prior probabilities and conditional probabilities. Purely subjective estimates of prior failure distributions may be used prior to production. More refined estimates based on historical data may be used if available.

Two embodiments are presented below, each of which is much more computationally efficient than integration of distributions. In the first embodiment below, the assumption is made that the probability of a test failing given failure of a particular component is proportional to the utilisation of that component by that test. The assumption is reasonable in many situations. For example, if all failures are point failures, and all point failures are equally likely, then utilisation and the probability of failure are proportional.

Assuming the tests are independent, the following equation can be used:

$$p(R_1,R_2/D) = p(R_1/D) * p(R_2/D) \text{ which gives:}$$

$$p(\text{test\_results}|cpu) = p(\text{memory\_test} = \text{fail}|cpu) * p(\text{video\_test} = \text{pass}|cpu) = 0.2 * 0.8$$

where 0.2 comes from the operation specification for the access memory operation which specifies that this operation utilises the cpu to a factor of 0.2 therefore the chance of the operation failing because the cpu is faulty is 0.2. The figure of 0.8 comes from the operation specification for the access video operation which specifies that this operation utilises the cpu to a factor of 0.2. Since the video test passed and therefore the access video operation passed, the chance of the cpu nevertheless being faulty is 1 minus 0.2=0.8.

The relative posterior probability is then found by multiplying the above figure by the prior probability for the cpu component (in the component database).

Hence relative_posterior_probability({cpu})= 0.2*0.8*0.01=0.0016.

Next we need to find whether any operations will necessarily be violated if cpu fails. A cpu failure causes memory_test to fail by causing the operation access_memory to fail. As access_memory is not used in the passing test video_test, then it is not violated. Hence no operation is necessarily violated, so no penalty is required.

The relative weight of the candidate diagnosis {port} is calculated in a similar manner:

$$p(\text{test results}|port) = p(\text{memory\_test} = \text{fail}|port) * p(\text{video\_test} = \text{pass}|port) = 0.9 * 0.1 = 0.09$$

Hence relative_posterior_probability(port) = 0.09 * 0.01 = 0.0009

A port failure causes memory_test to fail by causing the operation output_to_busport to fail. However, the passing test video_test also contains this operation; hence it is violated, because it passes in one test, and definitely fails in another. So the operation violation penalty of 0.1 needs to be applied.

Hence, $$\begin{aligned}\text{Relative weight}(port) &= \text{relative\_posterior\_probability}(port) * \text{operation\_violation\_penalty} \\ &= 0.0009 * 0.1 \\ &= 0.00009\end{aligned}$$

So {port} is significantly less likely as a diagnosis than {cpu}.

The embodiment described above could be simplified by omitting to specify the degree of utilisation of components in the operation specifications used in the functional test model. With this variation, operation specifications would simply refer to component names, without giving a utilisation factor. The factor p(R|D) in Equation 1 is then assumed to be one. Whilst this modified approach is not quite as refined, it can still give reasonable performance in certain circumstances. For example, in some systems the components are so simple that they are either tested fully by a functional test or not at all.

The embodiment described above assumes that component failures are independent, assumes that test results are independent and assumes that the degree of utilisation of a component by a particular test is proportional to the probability of the test failing given that the component is faulty. Even if the assumptions are incorrect, the resulting computed rank order of relative probabilities may still be satisfactorily accurate for some applications. For further explanation of why the embodiment described above may provide satisfactory diagnoses even when the independence assumptions are not true, see Russek, E. "The Effect of Assuming Independence in Applying Bayes' Theorem to Risk Estimation and Classification in Diagnosis", *Computers and Biomedical Research* 16, 537–552 (1983).

If independence of component failures is not assumed, Bayes' rule can require information that is rarely available and may be impractical to obtain. For example, consider the following:

Let $D=\{C_1, C_2, \ldots C_M\}$ be a diagnosis (a set of components presumed faulty)

and $R=\{R_1, R_2, \ldots R_N\}$ be a set of test results. From Bayes' rule:

$$p(D|R) = \frac{p(D) * p(R|D)}{p(R)}$$

Using the chain rule for conditional probabilities:

$$p(R|D)=p(R_1|D)*p(R_2|D,R_1)*p(R_3|D,R_1,R_2)\ldots*p(R_N|D,R_1\ldots R_{N-1})$$

Each term on the right must be estimated for all possible results (R) and diagnoses (D), which is frequently impractical. It is possible, however, to obtain a useful diagnosis assuming independence of test results and with minimal assumptions regarding failure distribution (no longer assuming probability proportional to coverage). Recall that the end goal of the analysis is a relative weighting or rank ordering of feasible diagnoses. That is, given a test result R, the goal is not to determine the probability of a set of components being the cause of the result, but instead, the goal is to determine, within the sets of components that might be the cause of the test result, which set of components is most likely the cause of a failing test. In a second embodiment, without making the assumption that the probability of a test failing given failure of a particular component is proportional to the utilisation of that component by that test, we can still derive useful information from a weighting function in which a weight W is computed as follows:

$$W(D,R)=p(D)*\mathrm{minimum}(\alpha_1, \alpha_2, \ldots \alpha_N) \quad \text{(Equation 3)}$$

where $\alpha_i$=(one minus utilisation of $C_j$ by test i, where test i is a passing test, and $C_j$ is a member of D) or $\alpha_i=1.0$ when test i fails.

Note that failing tests do not affect the minimum of ($\alpha_1$, $\alpha_2$, ... $\alpha_N$) and therefore may be ignored in equation 3. In the following example, only passing tests are used and Equation (3) is used to calculate weights. Let the component database entries be the same as the earlier examples above. Let the test models include the two test models used in the earlier examples and add a third test model and an additional operation specification as follows:

```
test_specification(dma_test,[ram_to_io])
   operation_specification(ram_to_io, [    [cpu, 0.1],
                                            [[ram, decoder], 0.65],
                                            [[ram, memory], 0.5],
                                            [port, 0.75]
                                       ] ).
```

Now assume that memory_test=fail, video_test=pass, dma_test=pass.

Let $R_1$={video_test=pass}, $R_2$={dma_test=pass}

Candidate diagnoses comprise components from failing tests only. Therefore, the candidate diagnoses (D) are:

$C_1$={cpu}, $C_2$={ram, decoder}, $C_3$={ram, memory}, $C_4$={data_bus}, $C_5$={port}

From Equation (3):

$W(D),R)=p(D)*\mathrm{minimum}\ (\alpha_1, \alpha_2, \ldots \alpha_N)$ where $\alpha_i$=one minus utilisation of D by test i $W(C_1, R)=p(C_1)*\mathrm{minimum}$ {[one minus utilisation of $C_1$ by test 1], [one minus utilisation of $C_1$ by test 2]}= 0.01*minimum {(1−0.2), (1−0.25)}=0.01*0.75= 0.0075

$W(C_5,R)=p(C_5)*\mathrm{minimum}$ {[one minus utilisation of $C_5$ by test 1][one minus utilisation of $C_5$ by test 2]}= 0.01*minimum {(1−0.9), (1−0.75)}=0.01*0.1=0.001

The weight for both tests passing given a CPU failure is higher than the weight for both tests passing given a port failure, so between the CPU and the port, we conclude that it is more probable that the CPU failed.

An additional refinement is made when subcomponents are present. For example, assume in the example above that the CPU consists of subcomponents A and B. If either A or B fails, then the CPU fails. Instead of computing a weight for the CPU, we compute a weight $W_A$ for subcomponent A and a weight $W_B$ for subcomponent B. The logical OR is bounded by the maximum value of a set of probabilities. That is, the probability that either subcomponent A or subcomponent B or both fail is bounded by the maximum of the probabilities of failure of the individual subcomponents. Accordingly, the appropriate weight for the CPU is then the maximum of $W_A$ and $W_B$. Then, in the above example, we compare the weight for both tests passing given a port failure to the maximum of the weights of both tests passing given a subcomponent A failure or subcomponent B failure.

Two embodiments for submodule 26 have been presented, each of which is computationally efficient. There is no one best embodiment for all applications. The best embodiment is application dependent, depending on actual distributions of failures and conditional probabilities. If the assumptions of the first embodiment are satisfied, this embodiment may provide more accurate diagnoses. Even if these assumptions are not satisfied, the first embodiment may still be useful for the reasons discussed in the article by Russek referenced earlier. The second embodiment, while providing a less precise estimate of probability, is more broadly applicable because it makes less restrictive assumptions. When the assumptions of the first embodiment are not satisfied, the second embodiment may provide more accurate diagnoses.

The embodiments presented for computing weights for submodule 26 are merely two examples and these embodiments are not an exhaustive list. The embodiments presented are particularly applicable in situations requiring computational efficiency (large data sets) and in situations where there is minimal cost penalty for an incorrect diagnosis. Other types of evidential reasoning may also be used to rank possible diagnoses. For example, Fuzzy Logic (see, for example, L. Zedeh and J. Kacpryzyk, *Fuzzy Logic for the Management of Uncertainty*, Wiley, 1992) or the Dempster-Shafer theory (see Dempster, A. P. "Upper and Lower Probability Induced by a Multi-valued Mapping", *Ann. Math. Statist.* 38: 325–339, (1967), Dempster, A. P., "A Generalization of Bayesian Inference", *R. Stat. Soc. J.* (B) 30, 205–247 (1968) and Shafer, G., *A Mathematical Theory of Evidence*, Princeton University Press, (1976)) could also be used. Each is similar in some respects to the embodiments described above. Fuzzy Logic frequently computes the AND function over several pieces of evidence by selecting the minimum support, and the OR function by the maximum, as in the second embodiment described above. Similarly, Dempster-Shafer theory computes upper and lower bounds on beliefs or weights.

The User Interface

The user interface 22 for presenting the results of diagnosis to the user consists of a simple window-based system for displaying a list of the most probable diagnoses for the observed set of test results. When all logically possible diagnoses have been assigned weights, those with low weights are eliminated. A diagnosis is considered to have a low weight if it is 1000 times less than the diagnosis with the highest weight. After low weight diagnoses have been eliminated, the remaining diagnoses are presented to the user, together with their weight, in order of likelihood. The user is also given, for each component, the component reference, the part number of the component and the descriptive text string.

Example output of the system 10 for a set of failed tests could be:

| Component Name | Relative Weight | Text Description | Component |
|---|---|---|---|
| xu8 | 200 | RAM simm | mm2345 |
| u44 | 50 | chipset | 80C486 |
| xu7 | | CPU-upgrade socket | sc27431 |
| & xu10 | 1 | socket simm | sc56473 |

Note that the last diagnosis consists of two failed components: xu7 and xu10.

The test engineer is then free to decide what action to take. In the example given here, the first step would be to try replacing component xu8 to see if that cures the problem.

The embodiment described above requires the system developer to enter a measure, in the range 0–1, of how much each operation exercises the behaviour of a given (sub) component. An alternative variation could be to enter a qualitative measure, say 'low', 'medium' or 'high', which is converted to a quantitative measure according to a set of system constants. This would have the benefit of making the system easier to develop, but would make it less accurate.

Although the present invention has been described in the context of diagnosing failures in the functional testing of circuit boards, it is readily applicable to other fields— potentially to any system which is composed of interacting components and which needs to undergo functional testing.

One example in another domain concerns a computer network. The components of the network would be workstations, PCs, bridges, hubs, routers etc and these would have subcomponents such as LAN cards, CPUs etc. Functional testing of the network might involve broadcasting a message over the network and this would involve certain operations such as creating the message using a CPU, transferring the message using LAN cabling, rerouting the message using routers etc etc.

For different fields of application the components database might have to be modified to take account of the way in which it is appropriate to format information in the particular domain, although such changes are likely to be of a cosmetic nature.

We claim:

1. A diagnostic system for diagnosing a cause of failures of functional tests made on a system under test wherein the system under test includes a plurality of interacting components and wherein the diagnostic system comprises:

memory means for storing data regarding the components of the system under test wherein data regarding connectivity of components is not necessary, data regarding test results, and data regarding the functional tests applied to the system under test, including information about which operations are performed in the system under test during a functional test and which components are involved in said operations; and means coupled to said memory means and responsive to data stored therein, for determining sets of components that are logically possible causes of test failures.

2. A diagnostic system according to claim 1 further comprising means for computing a weight for each logically possible cause of failures, and determining a most likely diagnosis based on the weights, said weights based on the degree to which operations utilise the components in the system under test.

3. A diagnostic system according to claim 2 which is operable to recognise when an operation is involved in both failing and passing tests (an 'operation violation') and wherein said means for computing a weight alters the weight assigned to a particular component when the particular component is utilized in no failing tests other than in tests involved in operation violations.

4. A diagnostic system according to claim 3 which is operable to apply a penalty factor to each candidate diagnosis (D) involving operation violations.

5. A diagnostic system according to claim 1, further comprising:

means for providing a list of each candidate diagnosis (D), ranked in order of probability.

6. A diagnostic system according to claim 1 comprising:

means for indicating further tests which could usefully be carried out following a diagnosis.

7. A diagnostic system according claim 1 which is integrated with a functional test system so that it further comprises:

means for storing test definitions;

means for performing tests on the system under test;

means for storing test results;

and wherein the diagnostic system is operable automatically to utilize the test results to diagnose causes of test failures.

8. A diagnostic system according to claim 1 which is operable to utilize the results of individual component tests generated prior to the system under test.

9. A diagnostic system according to claim 1 operable to diagnose faults in printed circuit boards or multi-chip modules.

* * * * *